United States Patent
Jotanovic

(10) Patent No.: US 8,498,595 B2
(45) Date of Patent: Jul. 30, 2013

(54) APPARATUS AND METHODS FOR AUTOMATIC PRESET

(75) Inventor: Mark Aleksandar Jotanovic, Saline, MI (US)

(73) Assignee: Toyota Motor Engineering & Manufacturing North America, Inc., Erlanger, NY (US)

( * ) Notice: Subject to any disclaimer, the term of this patent is extended or adjusted under 35 U.S.C. 154(b) by 148 days.

(21) Appl. No.: 13/023,681

(22) Filed: Feb. 9, 2011

(65) Prior Publication Data

US 2012/0202443 A1   Aug. 9, 2012

(51) Int. Cl.
*H04H 40/00* (2008.01)

(52) U.S. Cl.
USPC ..................... 455/186.1; 455/3.06

(58) Field of Classification Search
CPC ....................................................... H04B 1/18
USPC .................. 455/418, 186.1, 3.06, 556.1, 132, 455/133, 179.1, 188.1, 191.1, 230
See application file for complete search history.

(56) References Cited

U.S. PATENT DOCUMENTS

| | | | |
|---|---|---|---|
| 4,618,995 A | 10/1986 | Kemp | |
| 5,323,240 A | 6/1994 | Amano et al. | |
| 5,530,924 A | 6/1996 | Miller | |
| 5,734,444 A | 3/1998 | Yoshinobu | |
| 5,977,964 A | 11/1999 | Williams et al. | |
| 6,236,395 B1 * | 5/2001 | Sezan et al. | 715/723 |
| 6,240,280 B1 | 5/2001 | Ravi et al. | |
| 6,678,215 B1 * | 1/2004 | Treyz et al. | 368/10 |
| 7,003,289 B1 * | 2/2006 | Kolls | 455/422.1 |
| 7,324,953 B1 | 1/2008 | Murphy | |
| 7,437,124 B2 | 10/2008 | Bates et al. | |
| 7,519,341 B2 | 4/2009 | Doudnikoff et al. | |
| 7,587,185 B2 | 9/2009 | Nee | |
| 7,787,818 B2 | 8/2010 | Shapiro et al. | |
| 2002/0162101 A1 | 10/2002 | Gutta et al. | |
| 2004/0261040 A1 | 12/2004 | Radcliffe et al. | |
| 2006/0105702 A1 | 5/2006 | Muth et al. | |
| 2008/0076368 A1 | 3/2008 | Arrasvuori | |
| 2009/0170457 A1 | 7/2009 | Videtich | |
| 2010/0010648 A1 * | 1/2010 | Bull et al. | 700/94 |
| 2010/0285763 A1 | 11/2010 | Ingrassia et al. | |
| 2010/0321519 A1 * | 12/2010 | Bill | 348/222.1 |
| 2011/0078323 A1 * | 3/2011 | Wooden | 709/231 |

FOREIGN PATENT DOCUMENTS

KR     20080079434     9/2008

* cited by examiner

*Primary Examiner* — Sonny Trinh
(74) *Attorney, Agent, or Firm* — Snell & Wilmer LLP

(57) ABSTRACT

A preset device and an automatic preset application for ranking a group of content providers (e.g., radio stations) and for assigning one or more preset channels to the content providers with the top rankings. The preset device may include a timer configured to be coupled to a receiver, the timer configured to time a plurality of durations of a plurality of signals received from a plurality of content providers, a memory coupled to the timer, the memory configured to store the plurality of durations, and a processor coupled to the memory, the processor configured to rank the plurality of content providers based on the respective plurality of durations, and configured to preset the tuning device based on the ranked plurality of content providers.

20 Claims, 7 Drawing Sheets

APPARATUS AND METHODS FOR AUTOMATIC PRESET

BACKGROUND

1. Field

The present invention generally relates to the field of channel tuning, and more particularly to apparatus and methods for automatic preset.

2. Description of the Related Art

A radio system may include a radio receiver, a tuning device, and a set of preset buttons. A user may select a radio station by either adjusting the tuning device or by pressing one of the preset buttons. When the user selects a radio station by adjusting the tuning device, the user may have to remember the frequency channel of the radio station and spend time on searching for the particular frequency channel. On the other hand, using the preset buttons to select a radio station may be more convenient. Each of the preset buttons may be assigned to a frequency channel. When a preset button is pressed, the radio receiver may automatically be tuned to a pre-assigned radio station. As such, a user may save time in selecting radio stations when using the preset buttons.

A user may set up the preset buttons by using a conventional preset device. After a while, the listening habits of the user may change. The user may no longer be interested in those preset radio stations. Also, the user may find new favorite radio stations. If the user wants to change the preset button assignment, the user will need to manually reconfigure the preset buttons. Often, a user would like to assign preset buttons to those radio stations that are most listened to. In order to adjust conventional preset devices, the user will need to recognize the most listened-to radio stations and their corresponding frequency. However, the user often forgets the corresponding frequency channels of the most listened-to radio stations. As such, it is difficult for users to reconfigure the preset buttons by using conventional preset devices.

Thus, there is a need for a preset device that allows a user to automatically reconfigure the preset buttons.

SUMMARY

Several embodiments of the present invention may provide a preset device and an automatic preset application. The preset device and the automatic preset application may be used for ranking a group of content providers, such as a group of radio stations, based on the amount of time a user has spent on receiving content from each of the content providers. Accordingly, the preset device may assign one or more preset channels to the content providers with the top rankings.

In one embodiment, the present invention may provide a non-transitory computer storage medium storing instructions that when executed by a processor, cause the processor to perform a method of presetting a content receiving device configured to receive signals from a plurality of content providers. The method may comprise the steps of determining a reception duration of the signal received from each of the plurality of content providers, and assigning a plurality of presets to the plurality of content providers based on the respective reception duration.

In another embodiment, the present invention may provide a non-transitory computer storage medium storing instructions that when executed by a processor, cause the processor to perform a method of presetting a radio configured to receive signals from a plurality of radio stations. The method may comprises the steps of determining a reception duration of the signal received from each of the plurality of radio stations, and setting a preset channel to receive the signal from one of the plurality of radio stations based on the respective reception duration.

In yet another embodiment, the present invention may provide a preset device for presetting a content receiving device having a receiver and a tuning device. The preset device may include a timer configured to be coupled to the receiver, and configured to time a plurality of durations of a plurality of signals received from a plurality of content providers, a memory coupled to the timer, and configured to store the plurality of durations, and a processor coupled to the memory, and configured to rank the plurality of content providers based on the respective plurality of durations, and configured to preset the tuning device based on the ranked plurality of content providers.

BRIEF DESCRIPTION OF THE DRAWINGS

Other systems, methods, features, and advantages of the present invention will be or will become apparent to one with skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

Apparatus, systems and methods that implement the embodiment of the various features of the present invention will now be described with reference to the drawings. The drawings and the associated descriptions are provided to illustrate some embodiments of the present invention and not to limit the scope of the present invention. Throughout the drawings, reference numbers are re-used to indicate correspondence between reference elements. In addition, the first digit of each reference number indicates the figure in which the element first appears.

Figure 1:
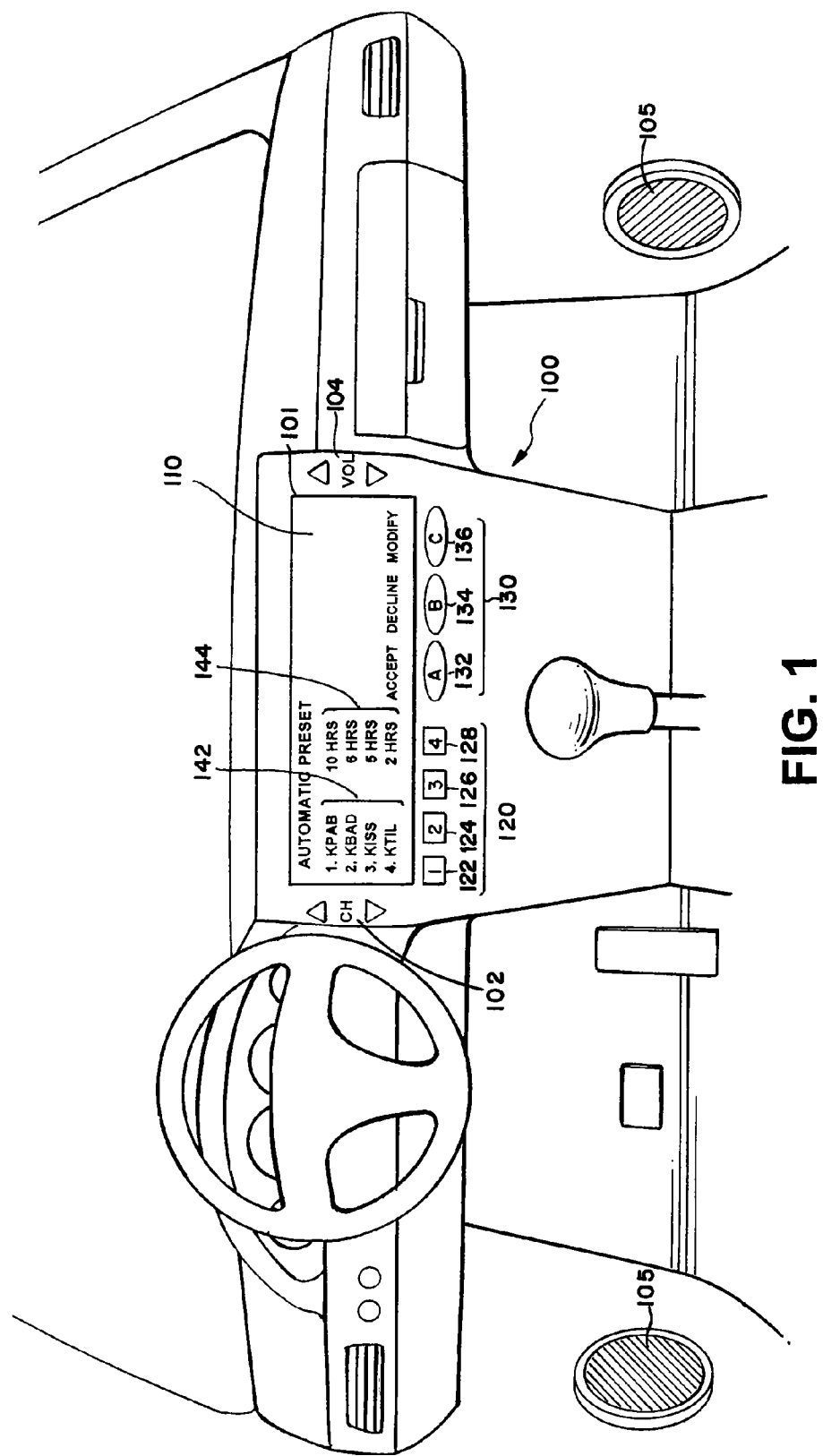
FIG. 1 shows a perspective view of a car stereo system with a preset device according to an embodiment of the present invention.

FIG. 1 shows a perspective view of a car audio or stereo system 100 with a preset device 110 according to an embodiment of the present invention. The car stereo system 100 may include tuning buttons 102, volume control buttons 104, a display screen 101, a preset input group 120, a multifunction input group 130, and two speakers 105. The tuning buttons 102 may be used for tuning a receiver, such that the receiver may receive signals from various radio stations. The volume control buttons 104 may be used for adjusting the volume outputted by the speakers 105. The display screen 101 may be used for displaying information and/or request generated by the preset device 110.

The preset input group 120 may include several preset buttons, such as a first preset button 122, a second preset button 124, a third preset button 126, and a fourth preset button 128. Each of the present buttons may control a preset channel, which may be used for tuning the receiver to a pre-assigned radio station. By pressing one of the preset buttons, a user may select a radio station without searching for it using the tuning buttons 102. The preset buttons may be implemented by one or more buttons or sensors for sensing a selection of a user. The sensors may include an optical sensor, a touch sensor, a mechanical sensor, and/or a proximity sensor. If the display screen 101 is a touched screen device, the preset buttons may be incorporated into the display screen 101.

The preset device 110 may automatically assign each of the preset buttons to a different radio station. The preset device 110 determines a reception duration for each radio station. Then, the preset device 110 may rank the radio stations based on their respective reception duration. Next, the preset device 110 may assign one or more preset buttons to the radio stations with the highest rankings. Generally, the reception duration of a radio station may be the total amount of time a user has spent on listening to that radio station over a particular time period. The reception duration of a radio station may be determined, for example, by timing the total reception time of a signal received from that radio station. In one embodiment, the reception duration for each radio station may be reset manually by the user or automatically at a particular time, for example, on a weekly, monthly or annual basis.

The assignment of the preset buttons may be fully automated or interactive. When the assignment is fully automated, the preset device 110 may automatically re-assign the preset buttons at the end of a predefined preset period. The predefined preset period may have a default value, which may be one day, one week, one month, or one year. Additionally, the predefined present period may be defined by a user. For example, the user may define the predefined preset period to be one or more days, one or more weeks, one or more months, or one or more years.

When the assignment is interactive, the preset device 110 may present the ranking result to a user and allow the user to accept, decline, and/or modify a proposed assignment of the preset buttons. For example, the preset device 110 may present a ranking list 142 to the user via the display screen 101. The ranking list 142 may include the names of the radio stations and/or the frequency channels (e.g., 97.1 or 102.7) of the radio stations. Optionally, the ranking list 142 may include a reception duration list 144, which may show the amount of time the user has spent on listening to each of the ranked radio stations. After presenting the ranking list 142, the preset device 110 may prompt the user to accept, decline, and/or modify the proposed preset assignment.

The user may make a selection by using the multifunction input group 130. The multifunction input group 130 may include several input buttons, such as a first input button (A) 132, a second input button (B) 134, and a third input button (C) 136. Each of the input buttons may be used for controlling one or more functions of the car stereo system 100. In one embodiment, for example, the first input button 132 may be used for accepting the proposed preset assignment, the second input button 134 may be used for declining the proposed preset assignment, and the third input button 136 may be used for modifying the proposed preset assignment.

Although FIG. 1 shows that the preset input group 120 includes four preset buttons, the preset input group 120 may include various numbers of preset buttons according to various embodiments of the present invention. As such, the ranking list 142 may include as many entries as the number of preset buttons may allow. Moreover, depending on the configuration of the car stereo system 100, the multifunction input group 130 may include various numbers of input buttons according to various embodiments of the present invention.

As discussed in FIG. 1, the preset device 110 may be used in a car stereo system 100. Moreover, the preset device 110 may be used in other content reception systems, which may include any electronic system that can select and receive content embedded signals from one or more content providers. As discussed herein, the term content may include video content, audio content, audio-video (AV) mixed content, data embedded audio content, data embedded video content, and/or data embedded AV mixed content. Hence, a content provider may include, but is not limited to, a radio station, a satellite radio station, an internet radio station, a television station, a cable television station, an online video store (distributor), an online music store (distributor), and/or an internet television website.

Figure 2:
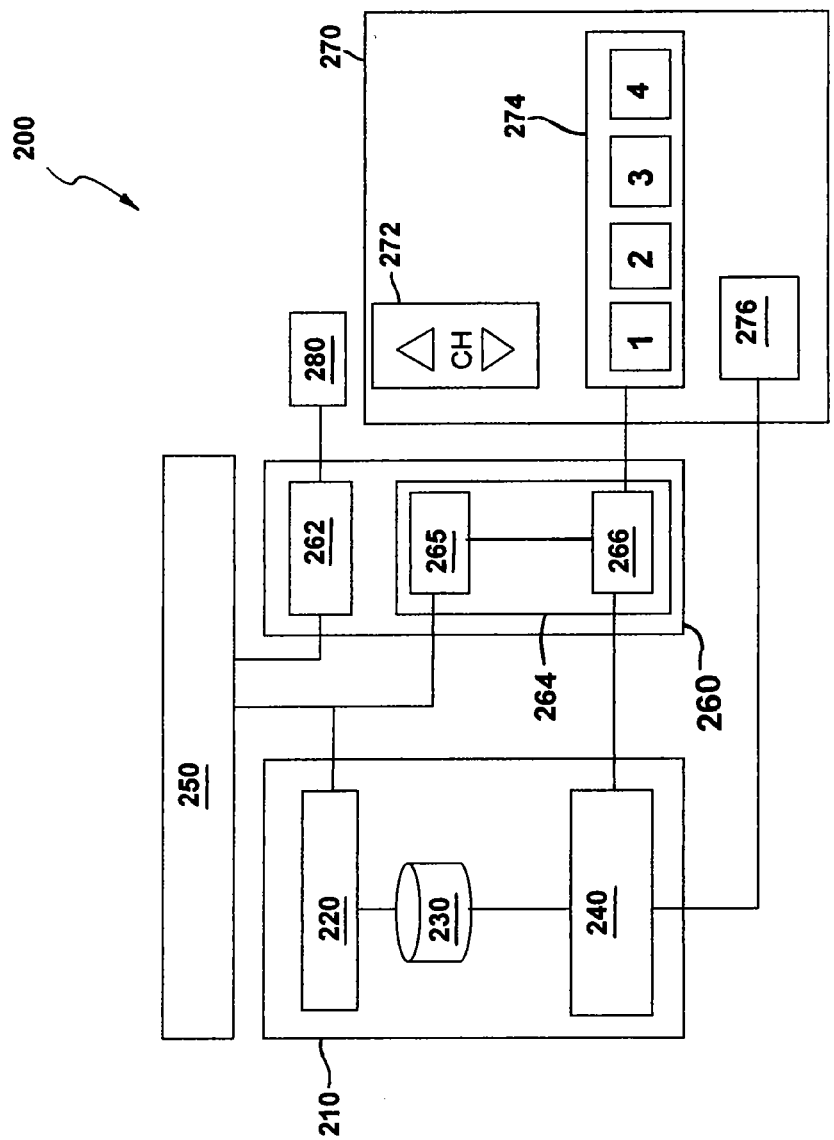
FIG. 2 shows a block diagram of a preset device for use in a content reception system according to an embodiment of the present invention.

FIG. 2 shows a block diagram of a preset device 210 for use in a content reception system 200 according to an embodiment of the present invention. The content reception system 200 may include a receiver 250, a content delivery device 260, a user interface 270, and an output device 280. The receiver 250 may be used for receiving one or more signals from one or more content providers.

The content delivery device 260 may be used for selecting and delivering content received from one or more content providers. In one embodiment, the content delivery device 260 may be integrated with the receiver 250 and/or the user interface 270. In another embodiment, the content delivery device 260 may be separated from the receiver 250 and the user interface 270. The content delivery device 260 may include a tuning device 264 and an output converter 262.

The tuning device 264 may control and configure the receiver 250 in such a way that the receiver 250 may receive signals with a wide range of carriers and formats. Generally, the tuning device 264 may include a tuning actuator 265 and a preset channel register 266. The tuning actuator 265 may be used for adjusting the impedance characteristics and/or receiving one or more channels of the receiver 250. The preset channel register 266 may be coupled to the tuning actuator 265. The preset channel register 266 may be used for controlling the output of the tuning actuator 265. For example, the preset channel register 266 may set one or more parameters in the tuning actuator 265, which may eventually be processed and used for adjusting the receiver 250.

The output converter 262 may be used for converting the received signals to one or more output signals. The output converter 262 may identify and extract content from the received signals. Then, the output converter 262 may generate the output signals based on the extracted content. The output signals may be used for driving the output device 282, which may include, but are not limited to, a video output device (e.g., a monitor screen) and/or an audio output device (e.g., a speaker). As such, the output converter 262 may format the output signals so that they will be compatible with the output device 282.

The user interface 270 may include a tuning input device 272, a preset input device 274, and a multifunction input-output (I/O) device 276. The tuning input device 272 may communicate with the tuning actuator 265. A user may access the tuning actuator 265 via the tuning input device 272. By controlling the tuning input device 272, a user may manually select a content provider (e.g., a radio station). The preset input device 274 may communicate with the preset channel register 266. A user may access the preset channel register 266 via the preset input device 274. By controlling the preset input device 274, the user may access one or more preset channels. Each of the preset channels may be assigned to a different content provider (e.g., a different radio station). Each of the preset channels may be used for controlling the tuning actuator 265, which may in turn be used for adjusting the impedance characteristics and/or the receiving channel of the receiver 250. By selecting an option or a button on the preset input device 274, a user may automatically select a content provider.

The preset device 210 may have similar structural and functional features as the preset device 110. Generally, the preset device 210 may include a timer 220, a memory 230, and a processor 240. In one embodiment, the preset device 210 may be an integral part of the content delivery device 260. In another embodiment, the preset device 210 may be a stand alone device that is locally connected to the content reception system 200. In yet another embodiment, the preset device 210 may be remotely connected to the content reception system 200 via a wired or wireless network.

The timer 220 may communicate with the tuning actuator 265 and the receiver 250. The timer 220 may be configured to measure the reception duration of a signal received form a particular content provider. For example, the timer 220 may probe the signal received by the receiver 250. In another example, the timer 220 may detect the adjustment initiated by the tuning actuator 265. The timer 220 may also determine the amount of time the tuning actuator 265 remains on a particular channel or receives information from a particular channel. The reception duration may be an indicator of the amount of time a user may have spent on receiving content from a content provider or listening to a particular channel.

The memory 230 may be coupled to the timer 220. The memory 230 may be used for storing information pertinent to the reception durations of one or more content providers. For example, the memory 230 may create a content provider record for each content provider. Each of the content provider records may store various pieces of information, such as the total amount of time the receiver 250 has spent on receiving signals from the respective content provider, the time slots during which the receiver 250 has received signals from the respective content provider, and the current ranking of the respective content provider. A time slot may have a default span of one hour. In one embodiment, a time slot may span from the beginning to the end of an hour (e.g., from 1:00 p.m. to 1:59 p.m.). In another embodiment, a time slot may span from the middle of an hour to the middle of a successive hour (e.g., from 1:30 p.m. to 2:29 p.m.). Moreover, a user may predefine the span of a time slot. For example, a time slot may have a predefine span of 15 minutes, 30 minutes, 1 hour, 2 hours, 3 hours, 4 hours, and so on.

The memory 230 may include, but is not limited to, random access memory (RAM), flash memory, read-only memory (ROM), EPROM, EEPROM, registers, hard disk, removable disk, CD-ROM, DVD, Blu-ray disk, wireless channels, and various other media capable of storing, containing or carrying instruction(s) and/or data. In addition to the records, the memory 230 may store one or more automatic preset applications, which are executable by the processor 240.

The processor 240 may be coupled to the memory 230, and it may communicate with the preset channel register 266 and the multifunction I/O device 276. The processor 240 may iteratively, periodically, and/or responsively update the information stored in the memory 230. For example, the processor 240 may monitor and accumulate the total reception duration of each content provider record. In another example, the processor 240 may reset the information of each content provider record upon receiving a user generated request, after a predefined or predetermined time period (e.g., once a month) or upon detecting an overflow error.

At the end of a predefined time period, the processor 240 may update the assignment of the preset input device 274. The predefined time period may have a default value, or it may be specified by a user. For example, the predefined time period may be one day, one week, one month and/or one year. In updating the assignment of the preset input device 274, the processor 240 may process the information stored in the memory 230. In one embodiment, the processor 240 may create a ranking list to rank the content providers according to their respective reception durations. In another embodiment, the processor 240 may create multiple ranking lists to rank the content providers according to their respective reception durations in several time slots. As such, each of the multiple ranking lists may indicate a user's preference within a particular time slot.

After creating the one or more ranking lists, the processor 240 may assign the options (buttons) of the preset input device 274 to the content providers with the highest rankings. The assignment process may be automatically done by the processor 240. As such, the processor 240 may preset or reset the preset channels of the preset channel register 266 without requesting any user feedback.

Alternatively, the assignment process may be interactive. The processor 240 may present one or more ranking lists to the user via the multifunction I/O device 276, which may include a display screen similar to the display screen 101 as shown in FIG. 1. The processor 240 may propose a new assignment for the options (buttons) of the preset input device 274. Then, the processor 240 may request the user to accept, decline, or modify the proposed new assignment. The processor 240 may receive a user generated response via the multifunction I/O device 276. Upon receiving the response, the processor 240 may reconfigure the preset channels of the preset channel register 266.

Generally, the processor 240 can be any computing device capable of receiving data, processing the received data, and outputting the processed data. The processor 240 may be implemented using hardware, software, firmware, middleware, microcode, or any combination thereof. The processor 240 may be an Advanced RISC Machine (ARM), a computer, a controller, a digital signal processor (DSP), a microprocessor, circuitry, a processor chip, or any other device capable of processing data, and combination thereof.

Although FIG. 2 shows the timer 220 as part of the preset device 210, the timer 220 may be part of the content delivery device 260 or the processor 240 according to other embodiments of the present invention. As such, the preset device 210 may include the memory 230 and the processor 240. Moreover, the preset device 210 may be implemented by a single integrated circuit (IC) chip or alternatively, by multiple IC chips.

Figure 3:
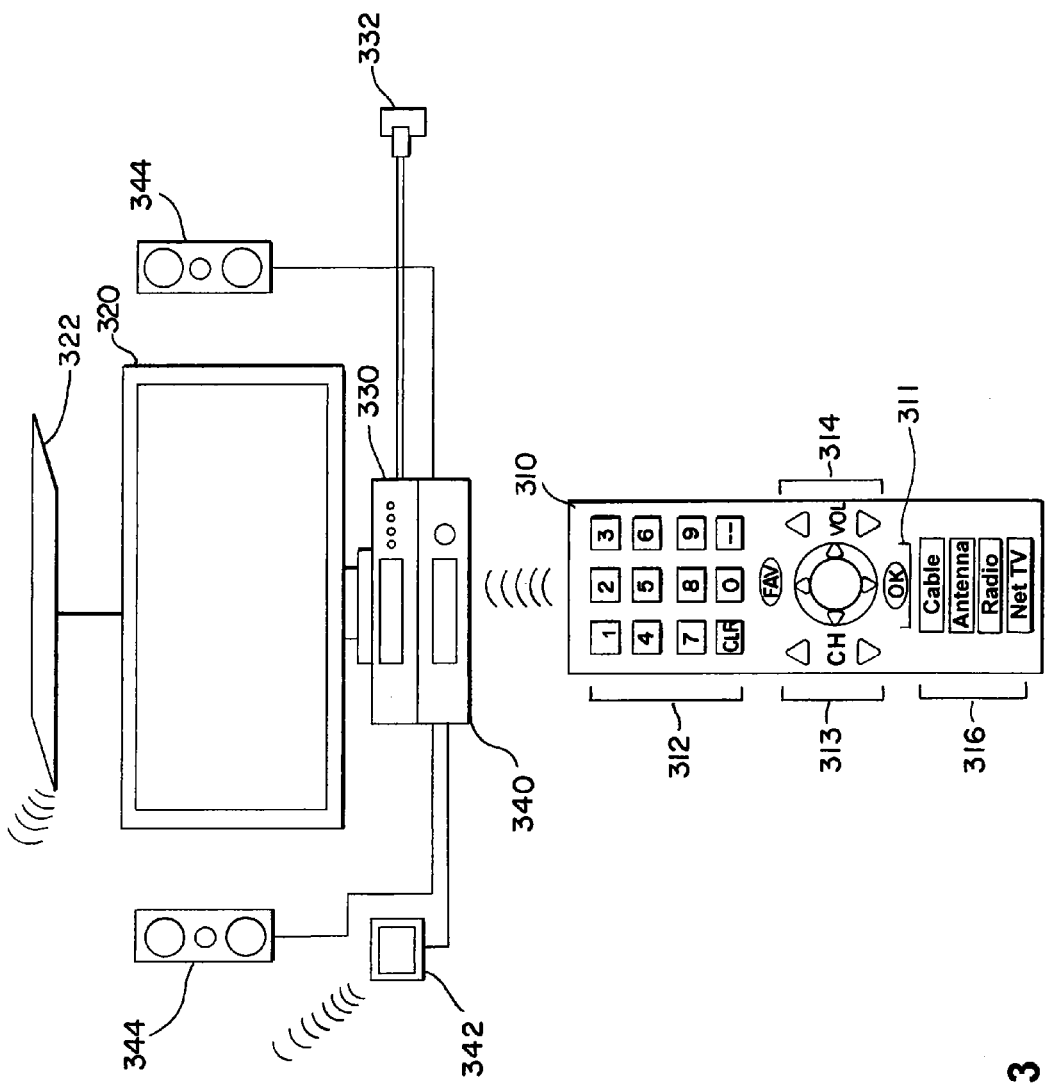
FIG. 3 shows a perspective view of a home entertainment system with multiple preset devices according to an embodiment of the present invention.

The preset device 210 may include multiple applications. For example, the preset device 210 may be applied to various content delivery devices of a home entertainment system. In FIG. 3, a perspective view of a home entertainment system 300 with one or more preset devices 210 is shown according to an embodiment of the present invention. The home entertainment system 300 may include a remote control 310, a television 320, a set-top box 330, and an audio device 340.

The remote control 310 may serve similar functions as the user interface 270 as discussed in FIG. 2. Generally, the remote control 310 may include various input buttons (options), such as several multifunction input buttons 311, numeric input buttons 312, tuning input buttons 313, volume control input buttons 314, and source selection buttons 316. The multifunction input buttons 311 may be used for providing inputs for one or more preset devices, which may be used for assigning one or more presets to the television 320, the set-top box 330, and/or the audio device 340.

The numeric input buttons 312 and the tuning input buttons 313 may serve similar functions as the tuning input device 272 as discussed in FIG. 2. The volume control input buttons 314 may be used for controlling the output volume of the television 320, the set-top box 330, and/or the audio device 340. The source selection buttons 316 may be used for connecting the output devices, such as the speakers 344 and/or the television 320, to a selected output source. The output source may include the television signals received by the television antenna 322, the radio signals received by the radio antenna 342, the cable television signals received by the cable outlet 332, and/or the internet television signals received by the cable outlet 332.

Each of the television 320, the set-top box 330, and the audio device 340 may be used for receiving content signals from one or more content providers. As such, the television 320, the set-top box 330, and the audio device 340 may each incorporate an individual content delivery device and/or an individual preset device.

The television 320 may be coupled to a television antenna 322, and it may incorporate a first content delivery device (not shown), which may have similar structural and functional features as the content delivery device 260. For example, the first content delivery device may be used for selecting a television station and receiving AV content from the selected television station.

Moreover, the television 320 may incorporate a first preset device (not shown), which may have similar structural and functional features as the preset device 210. For example, the first preset device may determine the reception duration of the signal received from each television station. Then, the first preset device may rank the television stations based on their respective reception duration. After generating a ranking list, the first preset device may automatically and/or interactively assign one or more television preset channels to the television stations with the highest rankings.

The set-top box 330 may be coupled to a cable outlet 332, and it may incorporate a second content delivery device (not shown), which may have similar structural and functional features as the content delivery device 260. For example, the second content delivery device may be used for selecting a cable television station and receiving AV content from the selected cable television station. For another example, the second content delivery device may be used for selecting an internet television (NET-TV) station and receiving AV content from the selected NET-TV station. For yet another example, the second content delivery device may be used for selecting a satellite television station and receiving AV content from the selected satellite station.

Moreover, the set-top box 330 may incorporate a second preset device (not shown), which may have similar structural and functional features as the preset device 210. For example, the second preset device may determine the reception duration of the signal received from each cable television station, NET-TV station, and/or satellite television station. Then, the second preset device may rank the television stations based on their respective reception duration. After generating a ranking list, the first preset device may automatically and/or interactively assign one or more television preset channels to the television stations with the highest rankings. The assignment order may be from highest ranking (preset button 1) to lowest ranking (preset button 4).

The audio device 340 may be coupled to a radio antenna 342, and it may incorporate a third content delivery device (not shown), which may have similar structural and functional features as the content delivery device 260. For example, the third content delivery device may be used for selecting a radio station (or satellite radio station) and receiving audio content from the selected radio station.

Moreover, the audio device 340 may incorporate a third preset device (not shown), which may have similar structural and functional features as the preset device 210. For example, the third preset device may determine the reception duration of the signal received from each radio station. Then, the third preset device may rank the radio stations based on their respective reception duration. After generating a ranking list, the third preset device may automatically and/or interactively assign one or more radio preset channels to the radio stations with the highest-to-lowest rankings.

According to an alternative embodiment, the remote device 310 may incorporate an integrated preset device. The integrated preset device may serve the combined functions of the first, second, and third preset devices as discussed previously. For example, the integrated preset device may assign the preset channels of the television 320, the set-top box 330, and the audio device 340 based on the signal reception activities of the first, second, and third content delivery devices.

As persons skilled in the art may readily appreciate, the preset device 210, and the equivalence thereof, may be applied to various content receiving devices for receiving contents from various types of content providers.

In one embodiment, for example, the preset device 210, and the equivalence thereof, may be applied to an audio receiver for receiving audio content from an audio content provider, a broadcast radio station, a subscription-based radio station, a frequency modulation (FM) radio station, an amplitude modulation (AM) radio station, a satellite radio station, and/or an Internet radio station.

In another embodiment, for example, the preset device 210, and the equivalence thereof, may be applied to an audio-video receiver for receiving audio-video content from an audio content provider, a video content provider, an audio-video content provider, a broadcast television station, a subscription-based television station, a cable television station, a satellite television station, and/or an Internet television station.

In yet another embodiment, for example, the preset device 210, and the equivalence thereof, may be applied to an interactive device, such as a web-browsing enabled computer and an online gaming device (e.g., an Xbox 360® console and a Playstation 3® console). The interactive device may be used for receiving interactive content from an interactive content provider, an Internet website server, and/or an online gaming server.

The discussion now turns to one or more algorithms of a preset application, which may be executed by the processor for use in a preset device, such as the preset device 210 as discussed in FIG. 2. Generally, the preset application, upon being executed by the processor, may assign several preset channels to several content providers based on the reception durations of the respective content providers. The content providers may include, but are not limited to, radio stations, satellite radio stations, television stations, cable television stations, NET-TV stations, and/or cable television stations. Accordingly, the preset application may invoke one or more functions of the processors as discussed in FIGS. 2 and 3.

Figure 4:
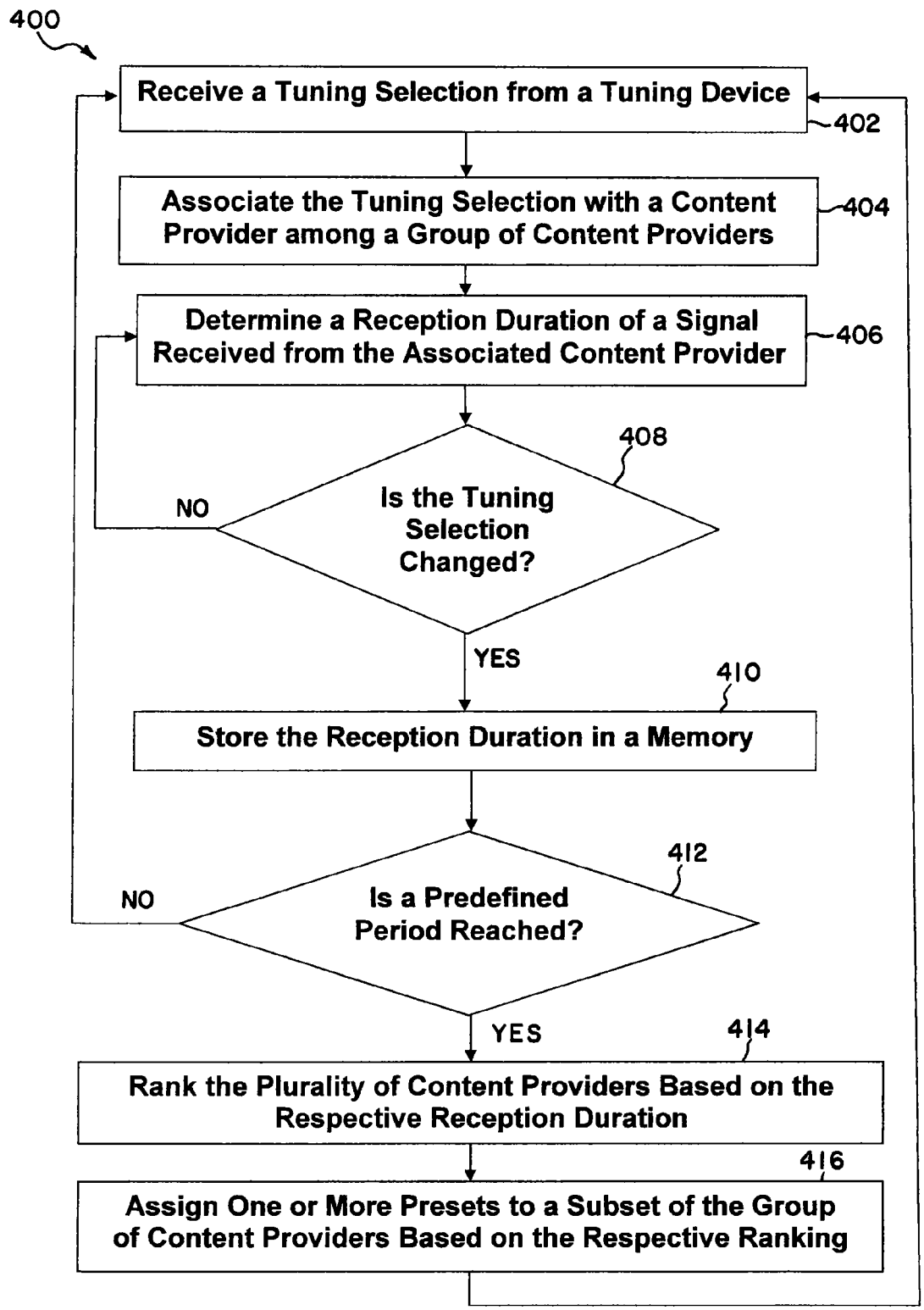
FIG. 4 shows a flowchart of an algorithm of an automatic preset application according to an embodiment of the present invention.

FIG. 4 shows a flowchart of an algorithm of an automatic preset application 400 according to an embodiment of the present invention. When executed by a processor, the automatic preset application 400 may cause the processor to perform the following method steps.

In step 402, the processor may receive a tuning selection from a tuning device. The tuning selection may be initiated by a user. A tuning device may generate a control signal for adjusting a receiver based on the user initiated tuning selection. The receiver and the tuning device may be used in various content reception systems. For example, the receiver and the tuning device may be used in a car stereo system, a portable radio, a satellite radio system, a home entertainment system, a television system, a cable television system, a satellite television system, and/or a NET-TV system. By receiving the tuning selection, the processor may ascertain which channel the user is selecting.

In step 404, the processor may associate the tuning selection with a content provider among a group of content providers. Depending on the type of content reception system with which the processor is interacting, the content provider may be a radio station, a television station, a satellite radio station, a cable television station, a satellite television station, and/or a NET-TV station.

In step 406, the processor may determine a reception duration of a signal received from the associated content provider or a duration of time spent communicating with the associated content provider. The processor may iteratively, periodically, and/or responsively calculate the time spent on receiving a signal from the associated content provider or communicating with the associated content provider. For example, the processor may use a timer to measure the time elapsed between the reception of a first tuning selection and a second tuning selection. The first tuning selection may be used for selecting a current (first) content provider while the second tuning selection may be used for selecting a next (second) content provider. Typically, the processor may determine the reception duration of the signal received from the current content provider.

In step 408, the processor may determine whether the tuning selection is changed. Generally, the tuning selection is changed whenever a user decides to switch from the current content provider to a next content provider. In other words, if a user stays with a current content provider, the tuning selection will not be changed. The processor may iteratively, periodically, and/or responsively probe the status of the tuning selection to determine whether the user has switched between content providers. If the processor determines that the tuning selection has not been changed, the automatic preset application 400 may return to step 406, in which the processor may continue timing the reception duration of the associated content provider. On the other hand, if the processor determines that the tuning selection has been changed, the automatic preset application 400 may proceed to step 410.

In step 410, the processor may store the reception duration of the current content provider. The processor may search in a memory for a content provider record that belongs to the current content provider. After locating the content provider record, the processor may update the content provider record by accumulating the current reception duration to a value stored in a total reception duration field. If the content provider record does not exist, the processor may create one for the current content provider. Then, the processor may create a total reception duration field in the newly created record and store the current reception duration to the total reception duration field.

In step 412, the processor may determine whether a predefined time period is reached. A predefined time period may be a default time frame or period at the end of which the processor may reassign one or more preset channels. Alternatively, a user may specify how long the predefined time period may last. For example, the predefined time period may last for one or more days, weeks, months, and/or years. If a predefined time period has not been reached, the automatic preset application 400 may return to step 402, in which the processor may receive a different tuning selection and begin determining another reception duration for another content provider. On the other hand, if a predefined time period has been reached, the automatic preset application 400 may proceed to step 414.

In step 414, the processor may rank the group of content providers based on the respective reception duration. The processor may compare the value of the total reception duration field of each content provider record against one another. The processor may generate a ranking list to store the ranking result. After the processor ranks the group of content providers, the processor may reset the value of the total reception duration field of each content provider record. Alternatively, the processor may allow the value of the total reception duration field of each content provider to be accumulated during the next predefined period.

In step 416, the processor may assign one or more presets to a subset of the group of content providers based on their respective ranking. Generally, the processor may assign a preset with a lowest numeric label to a content provider with the highest ranking. Alternatively, the processor may assign a preset with a highest numeric label to a content provider with the highest ranking. The size of the subset may depend on the number of available preset channels.

Figure 5:
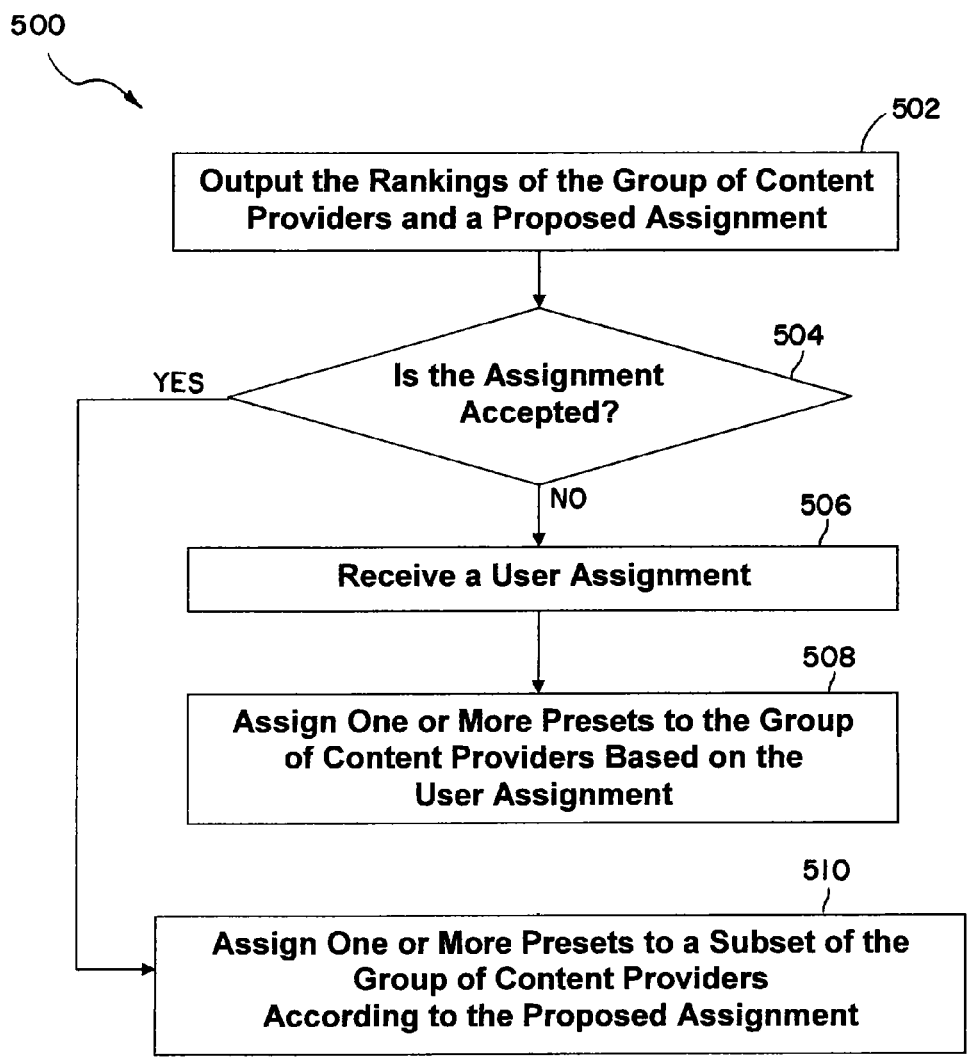
FIG. 5 shows a flowchart of an algorithm of a preset assignment subroutine according to an embodiment of the present invention.

FIG. 5 shows a flowchart of an algorithm of a preset assignment subroutine 500 according to an embodiment of the present invention. When executed by a processor, the preset assignment subroutine 500 may cause the processor to perform the following method steps.

In step 502, the processor may output the rankings of the group of content providers and a proposed assignment. In step 504, the processor may determine whether the proposed assignment is accepted by a user. If the proposed assignment is accepted, the subroutine 500 may proceed to step 510, in which the processor may assign one or more presets to a subset of the group of content providers according to the proposed assignment. For example, the processor may reconfigure the preset to hold information related to the subset of the group of content providers. On the other hand, if the proposed assignment is not accepted, the subroutine 500 may proceed to step 506.

In step 506, the processor may receive a user assignment, which may or may not be the same as the assignment proposed by the processor. In step 508, the processor may assign one or more presets to a subset of the group of content providers based on the user assignment.

Figure 6:
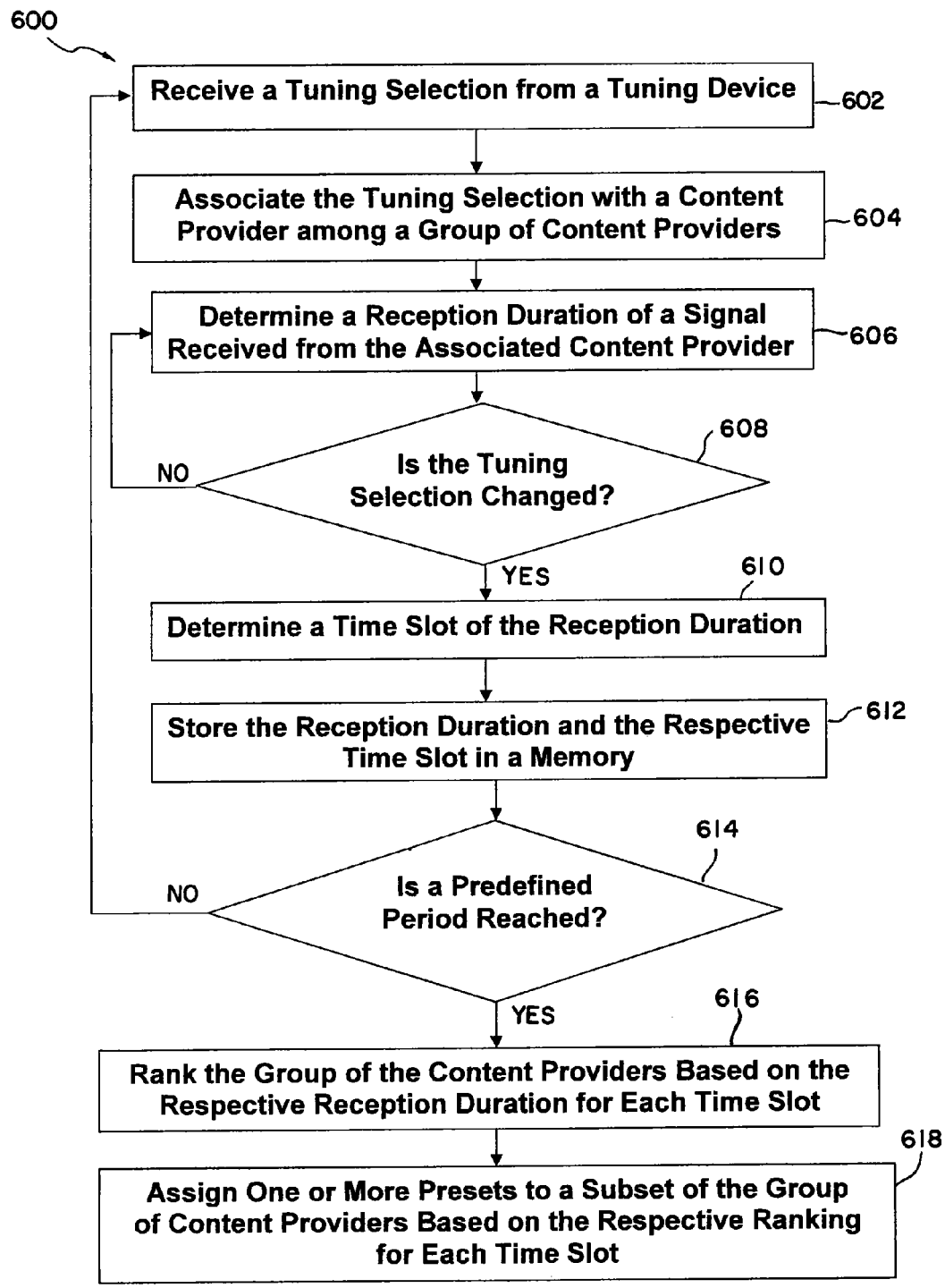
FIG. 6 shows a flowchart of an algorithm of an automatic preset application according to an alternative embodiment of the present invention.

FIG. 6 shows a flowchart of an algorithm of an automatic preset application 600 according to an alternative embodiment of the present invention. When executed by a processor, the automatic preset application 600 may cause the processor to perform the following method steps.

In step 602, the processor may receive a tuning selection from a tuning device. The tuning selection may be initiated by a user. A tuning device may generate a control signal for adjusting a receiver based on the user initiated tuning selection. The receiver and the tuning device may be used in various content reception systems. For example, the receiver and the tuning device may be used in a car stereo system, a portable radio, a satellite radio system, a home entertainment system, a television system, a cable television system, a satellite television system, and/or a NET-TV system. By receiving the tuning selection, the processor may ascertain which channel the user is selecting.

In step 604, the processor may associate the tuning selection with a content provider among a group of content providers. Depending on the type of content reception system with which the processor is interacting, the content provider may be a radio station, a television station, a satellite radio station, a cable television station, a satellite television station, and/or a NET-TV station.

In step 606, the processor may determine a reception duration of a signal received from the associated content provider. The processor may iteratively, periodically, and/or responsively calculate the time spent on receiving a signal from the associated content provider. For example, the processor may use a timer to measure the time elapse between the reception of a first tuning selection and a second tuning selection. The first tuning selection may be used for selecting a current (first) content provider while the second tuning selection may be used for selecting a next (second) content provider. Typically, the processor may determine the reception duration of the signal received from the current content provider.

In step 608, the processor may determine whether the tuning selection is changed. Generally, the tuning selection is changed whenever a user decides to switch from the current content provider to a next content provider. In other words, if a user stays with a current content provider, the tuning selection will not be changed. The processor may iteratively, periodically, and/or responsively probe the status of the tuning selection to determine whether the user has switched content providers. If the processor determines that the tuning selection has not been changed, the automatic preset application 600 may return to step 606, in which the processor may continue timing the reception duration of the associated content provider. On the other hand, if the processor determines that the tuning selection has been changed, the automatic preset application 600 may proceed to step 610.

Figure 7:
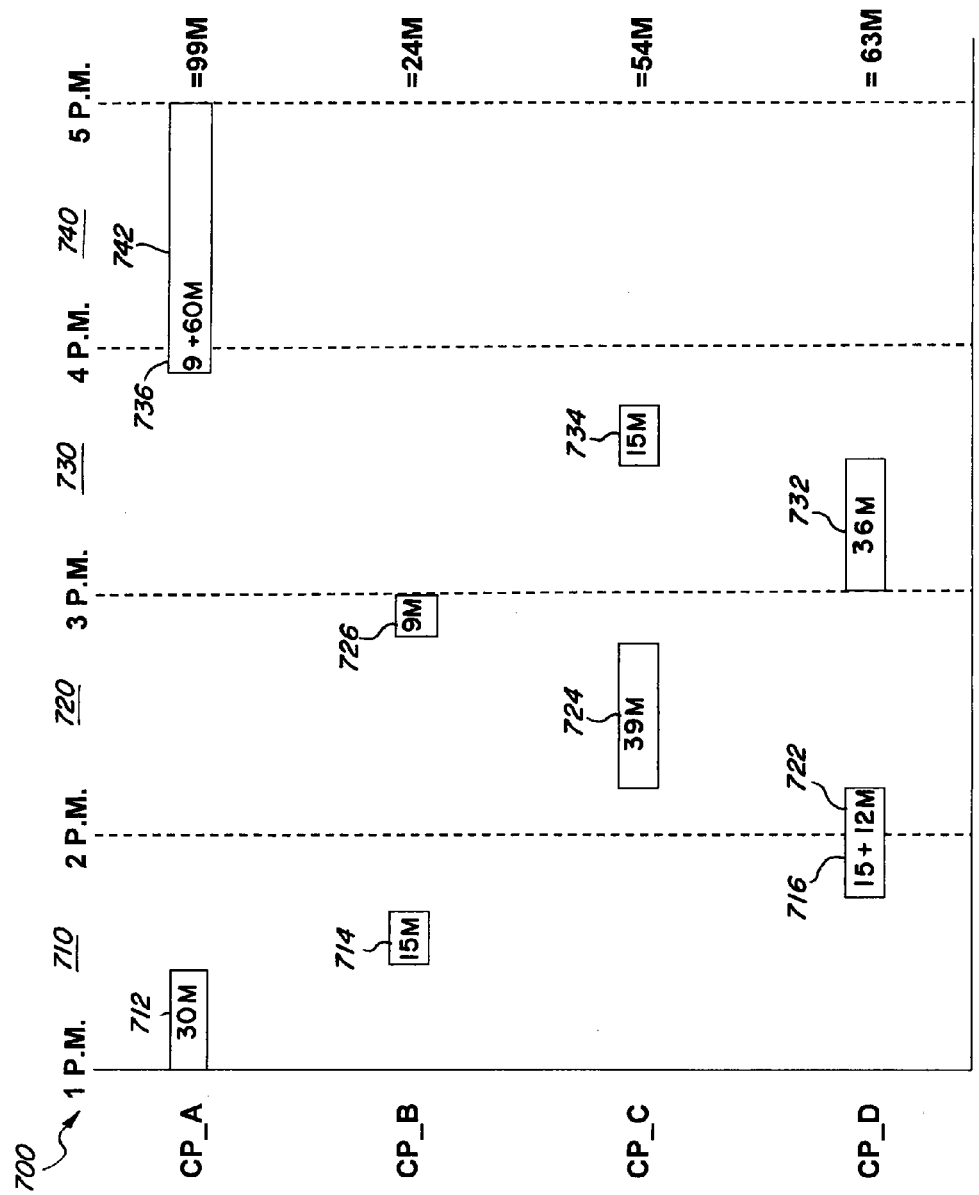
FIG. 7 shows an exemplary time chart of signals received from various content providers.

In step 610, the processor may determine a time slot in which the reception duration is situated. Generally, a time slot may be predefined to cover an interval of a 24-hour period within a day. Referring to FIG. 7, an exemplary time chart 700 with four time slots is shown. Each of the four time slots may have a start time and an end time, both of which may be predefined by a user and/or by the automatic preset application 600. For example, a first time slot 710 may span from 1:00 p.m. to 1:59 p.m., a second time slot 720 may span from 2:00 p.m. to 2:59 p.m., a third time slot 730 may span from 3:00 p.m. to 3:59 p.m., and a fourth time slot 740 may span from 4:00 p.m. to 4:59 p.m.

Signals may be received from a content provider A (CP_A) during the first time slot 710, the third time slot 730, and the fourth time slot 740. As such, the signals received from the content provider A may have a first reception duration 712, a second duration 736, and a third duration 742. The first reception duration 712 may last for about 30 minutes, and it may be within the first time slot 710. The second reception duration 736 may last for about 9 minutes, and it may be within the third time slot 730. The third reception duration 742 may last for about 60 minutes, and it may be within the fourth time slot 740. Although the second reception duration 736 and the third reception duration 742 are shown as two separate reception durations, they may be treated as a single reception duration that spans across the third time slot 730 and the fourth time slot 740.

Signals may be received from a content provider B (CP_B) during the first time slot 710 and the second time slot 720. As such, the signals received from the content provider B may have a first reception duration 714 and a second duration 726. The first reception duration 714 may last for about 15 minutes, and it may be within the first time slot 710. The second reception duration 726 may last for about 9 minutes, and it may be within the second time slot 720.

Signals may be received from a content provider C (CP_C) during the second time slot 720 and the third time slot 730. As such, the signals received from the content provider C may have a first reception duration 724 and a second reception duration 734. The first reception duration 724 may last for about 39 minutes, and it may be within the second time slot 720. The second reception duration 734 may last for about 15 minutes, and it may be within the third time slot 730.

Signals may be received from a content provider D (CP_D) during the first time slot 710, the second time slot 720, and the third time slot 730. For example, the signals received from the content provider D may have a first reception duration 716, a second reception duration 722, and a third reception duration 732. The first reception duration 716 may last for about 15 minutes, and it may be within the first time slot 710. The second reception duration 722 may last for about 12 minutes, and it may be within the second time slot 720. The third reception duration 732 may last for about 36 minutes, and it may be within the third time slot 730. Although the first reception duration 716 and the second reception duration 722 are shown as two separate reception durations, they may be treated as a single reception duration that spans across the first time slot 710 and the second time slot 720.

Each time a change in tuning selection is detected, the processor may determine the time slot of the recently tuned out signal. For example, when the tuning selection changes from the content provider A to the content provider B, the processor may determine that the first reception duration of the content provider A is within the first time slot 710. In another example, when the tuning selection changes from the content provider D to the content provider C, the processor may determine that the first reception duration 716 of the content provider D is within the first time slot 710 while the second reception duration 722 of the content provider D is within the second time slot 720.

Referring again to FIG. 6, the processor may, in step 612, store the reception duration and the respective time slot in a memory. The processor may search in a memory for a content provider record that belongs to the current content provider. After locating the content provider record, the processor may update the content provider record by accumulating the current reception duration to a value stored in a total reception duration field. If the content provider record does not exist, the processor may create one for the current content provider. Then, the processor may create a total reception duration field in the newly created record and store the current reception duration to the total reception duration field.

In one embodiment, the total reception duration field may contain, or be partitioned into, several sub-fields, each of which may be allocated for recording the reception duration within a particular time slot. For example, referring again to FIG. 7, the total reception duration field may have a first sub-field allocated for the first time slot 710, a second sub-field allocated for the second time slot 720, a third sub-field allocated for the third time slot 730, and a fourth sub-field allocated for the fourth time slot 740.

In storing the reception duration for content provider A, the processor may record 30 minutes in the first sub-field, 0 minute in the second sub-field, 9 minutes in the third sub-field, and 60 minutes in the fourth sub-field. Additionally, the processor may record 99 minutes for the content provider in the total reception duration field (a.k.a. main field) of the record.

In storing the reception duration for content provider B, the processor may record 15 minutes in the first sub-field, 9 minute in the second sub-field, 0 minute in the third sub-field, and 0 minute in the fourth sub-field. Additionally, the processor may record 24 minutes for the content provider in the total reception duration field of the record.

In storing the reception duration for content provider C, the processor may record 0 minute in the first sub-field, 39 minutes in the second sub-field, 15 minutes in the third sub-field, and 0 minute in the fourth sub-field. Additionally, the processor may record 54 minutes for the content provider in the total reception duration field of the record.

In storing the reception duration for content provider D, the processor may record 15 minutes in the first sub-field, 12 minute in the second sub-field, 36 minutes in the third sub-field, and 0 minute in the fourth sub-field. Additionally, the processor may record 63 minutes for the content provider in the total reception duration field of the record.

Referring again to FIG. 6, the processor may, in step 614, determine whether a predefined period is reached. A predefined period may be a default time frame at the end of which the processor may reassign one or more preset channels. Alternatively, a user may specify how long the predefined period may last. For example, the predefined period may last for one or more days, weeks, months, and/or years. If a predefined period is not reached, the automatic preset application 600 may return to step 602, in which the processor may receive a different tuning selection and begin determining another reception duration for another content provider. On the other hand, if a predefined period is reached, the automatic preset application 600 may proceed to step 616.

In step 616, the processor may rank the group of content providers based on the respective reception duration for each time slot. Unlike step 414 of the automatic preset application 400, in which the content providers are ranked based on their respective total reception durations, the processor in step 616 may rank the content providers based on their respective reception durations in each time slot. Referring again to FIG. 7, for example, the processor in step 414 may rank the content provider A (99 minutes) first, the content provider D (63 minutes) second, the content provider C (54 minutes) third, and the content provider B (24 minutes) the fourth.

In contrast, the processor in step 616 may generate a ranking during each time slot. For example, during the first time slot 710, the processor may rank the content provider A (30 minutes) first, the content provider B (15 minutes) and the content provider D (15 minutes) second, and the content provider C (0 minute) the fourth.

During the second time slot 720, the processor may rank the content provider C (39 minutes) first, the content provider D (12 minutes) second, the content provider B (9 minutes) third, and the content provider A (0 minute) fourth.

During the third time slot 730, the processor may rank the content provider D (36 minutes) first, the content provider C (15 minutes) second, the content provider A (9 minutes) third, and the content provider B (0 minute) fourth.

During the fourth time slot 740, the processor may rank the content provider A (60 minutes) first, while ranking the content provider B (0 minute), the content provider C (0 minute), and the content provider D (0 minute) second.

The processor may generate a ranking list for each time slot to store the ranking result. After the processor ranks the group of content providers in each time slot, the processor may reset the value of the several sub-fields of the total reception duration field of each content provider record. Alternatively, the processor may allow the values of the several sub-fields to be accumulated during the next predefined period.

Referring again to FIG. 6, the processor, in step 618, may assign one or more presets to a subset of the group of content providers based on their respective ranking for each time slot. Generally, the processor may assign a preset with a lowest numeric label to a content provider with the highest ranking. Alternatively, the processor may assign a preset with a highest numeric label to a content provider with the highest ranking. The size of the subset may depend on the number of available preset channels.

Although FIGS. 6 and 7 show that the automatic preset application 600 may create multiple preset assignments for several predefined time slots, the automatic preset application 600 may be adapted or modified to create multiple preset assignments for several predefined days within a week. In an alternative embodiment, an automatic preset application may generate a ranking for a group of content providers in each day during a week. Accordingly, the automatic preset application may have a first set of preset assignments for Monday, a second set of preset assignments for Tuesday, a third set of preset assignments for Wednesday, a fourth set of preset assignments for Thursday, a fifth set of preset assignments for Friday, a sixth set of preset assignments for Saturday, and a seventh set of preset assignments for Sunday. Optionally, the automatic preset application may further subdivide each set of preset assignments into several time slots, the algorithm of which may be similar to that of the automatic preset application 600.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A non-transitory computer storage medium storing instructions that when executed by a processor, cause the processor to perform a method for presetting a content receiving device, the method comprising:
   receiving a signal from each of a plurality of content providers;
   determining a reception duration of the signal received from each of the plurality of content providers; and
   assigning at least one of a plurality of presets to at least one of the plurality of content providers based on the respective reception duration.

2. The non-transitory computer storage medium of claim 1, further storing instructions that when executed by the processor, cause the processor to perform a method comprising:
   receiving a tuning selection from a tuning device; and
   associating the tuning selection with one of the plurality of content providers.

3. The non-transitory computer storage medium of claim 1, wherein the determining the reception duration of the signal received further includes:
- measuring a time elapsed between receiving a first tuning selection and a second tuning selection, wherein the first tuning selection is for selecting a first content provider of the plurality of content providers and the second tuning selection is for selecting a second content provider of the plurality of content providers; and
- determining the reception duration of the first content provider based on the measured time.

4. The non-transitory computer storage medium of claim 1, wherein the determining the reception duration of the signal received includes:
- measuring a time elapsed between receiving a first tuning selection and a second tuning selection, wherein the first tuning selection is for selecting a first content provider and the second tuning is for selecting a second content provider;
- retrieving, from a memory, the reception duration of the first content provider; and
- accumulating the time to the reception duration of the first content provider.

5. The non-transitory computer storage medium of claim 1, wherein the assigning the at least one of the plurality of presets includes:
- ranking the plurality of content providers based on the respective reception durations; and
- reconfiguring the at least one of the plurality of presets to hold tuning information related to at least one top ranked content provider of the plurality of content providers.

6. The non-transitory computer storage medium of claim 1, further storing instructions that when executed by the processor, cause the processor to perform a method comprising:
- determining, for each of the plurality of content providers, a time slot among a plurality of time slots based on a starting point and an ending point of the reception duration.

7. The non-transitory computer storage medium of claim 6, wherein each of the plurality of time slots is predefined to cover an interval of a 24-hour period.

8. The non-transitory computer storage medium of claim 6, wherein the assigning the at least one of the plurality of presets includes:
- ranking, for each of the plurality of time slots, the plurality of content providers based on the respective reception durations; and
- reconfiguring, for each of the plurality of time slots, the plurality of presets to hold tuning information related to a subset of top ranked content providers of the plurality of content providers.

9. The non-transitory computer storage medium of claim 1, wherein the plurality of content providers are selected from a group consisting of audio content providers, video content providers, audio-video content providers, interactive content providers, and combinations thereof.

10. The non-transitory computer storage medium of claim 1, wherein the plurality of content providers are selected from a group consisting of broadcast radio stations, subscription-based radio stations, broadcast television stations, subscription-based television stations, interne websites, online gaming servers, and combinations thereof.

11. A non-transitory computer storage medium storing instructions that when executed by a processor, cause the processor to perform a method for presetting a radio configured to receive a signal from each of a plurality of radio stations, the method comprising:
- determining a reception duration of the signal received from each of the plurality of radio stations; and
- setting a preset channel to receive the signal from one of the plurality of radio stations based on the respective reception duration.

12. The non-transitory computer storage medium of claim 11, wherein the determining the reception duration of the signal includes:
- measuring a time elapsed between receiving a first tuning selection and a second tuning selection, wherein the first tuning selection is for selecting a first radio station of the plurality of radio stations and the second tuning selection is for selecting a second radio station of the plurality of radio stations; and
- determining the reception duration of the first radio station based on the measured time.

13. The non-transitory computer storage medium of claim 11, wherein the determining the reception duration of the signal includes:
- measuring a time elapsed between receiving a first tuning selection and a second tuning selection, wherein the first. tuning selection is for selecting a first radio station of the plurality of radio stations and the second tuning selection is for selecting a second radio station of the plurality of radio stations;
- retrieving, from a memory, the reception duration of the first radio station; and
- accumulating the time to the reception duration of the first radio station.

14. The non-transitory computer storage medium of claim 11, wherein the setting the preset channel includes:
- ranking the plurality of radio stations based on the respective reception durations; and
- reconfiguring the preset channel to hold tuning information related to a top ranked radio station of the plurality of radio stations.

15. The non-transitory computer storage medium of claim 11, further storing instructions that when executed by the processor, cause the processor to perform a method comprising:
- determining, for each of the plurality of radio stations, a time slot among a plurality of time slots based on a starting point and an ending point of the reception duration, wherein each of the plurality of time slots is predefined to cover an interval of a 24-hour period.

16. The non-transitory computer storage medium of claim 15, wherein the setting the preset channel includes:
- ranking, for each of the plurality of time slots, the plurality of radio stations based on the respective reception durations; and
- reconfiguring, for each of the plurality of time slots, the preset channel to hold tuning information related to a top ranked radio station of the plurality of radio stations.

17. The non-transitory computer storage medium of claim 11, wherein the plurality of radio stations are selected from a group consisting of frequency modulation (FM) radio stations, amplitude modulation (AM) radio stations, satellite radio stations, Internet radio stations, and combinations thereof 18. A preset device for presetting a content receiving device having a receiver and a tuning device, the preset device comprising:
- a timer configured to be coupled to the receiver, and configured to time a plurality of durations of a plurality of signals received from a plurality of content providers;
- a memory coupled to the timer, and configured to store the plurality of durations; and a processor coupled to the memory, and configured to:
   rank the plurality of content providers based on the respective plurality of durations, and
   preset the tuning device based on the ranked plurality of content providers.

19. The preset device of claim 18, wherein:
the processor is configured to be coupled to a preset channel register of the tuning device, and
the processor is configured to update the preset channel register with information related to one or more top ranked content providers of the plurality of content providers.

20. The preset device of claim 18, wherein the plurality of content providers are selected from a group consisting of broadcast radio stations, subscription-based radio stations, broadcast television stations, subscription-based television stations, internet websites, online gaming servers, and combinations thereof.

\* \* \* \* \*